(12) United States Patent
Han et al.

(10) Patent No.: US 12,501,804 B2
(45) Date of Patent: Dec. 16, 2025

(54) DISPLAY PANEL HAVING HOLLOW OPENING AND DISPLAY DEVICE

(71) Applicant: BOE Technology Group Co., Ltd., Beijing (CN)

(72) Inventors: Long Han, Beijing (CN); Pinfan Wang, Beijing (CN); Fangxu Cao, Beijing (CN); Wenqiang Li, Beijing (CN); Libin Liu, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 613 days.

(21) Appl. No.: 17/908,017

(22) PCT Filed: May 21, 2021

(86) PCT No.: PCT/CN2021/095316
§ 371 (c)(1),
(2) Date: Aug. 30, 2022

(87) PCT Pub. No.: WO2021/238814
PCT Pub. Date: Dec. 2, 2021

(65) Prior Publication Data
US 2023/0088068 A1   Mar. 23, 2023

(30) Foreign Application Priority Data

May 26, 2020   (CN) .......................... 202010454585.X (51) Int. Cl.
*H10K 59/35* (2023.01)
*H10K 50/84* (2023.01)
(Continued)

(52) U.S. Cl.
CPC .......... *H10K 59/353* (2023.02); *H10K 50/84* (2023.02); *H10K 59/1213* (2023.02);
(Continued)

(58) Field of Classification Search
CPC .... H10K 59/353; H10K 59/352; H10K 59/12; H10K 59/126
See application file for complete search history.

(56) References Cited

U.S. PATENT DOCUMENTS

2009/0009441 A1* 1/2009 Yamamoto ........... G09G 3/3233
345/80
2015/0243683 A1* 8/2015 Lee ....................... H10D 86/431
257/40
(Continued)

FOREIGN PATENT DOCUMENTS

CN    108417606 A    8/2018
CN    108666352 A    10/2018
(Continued)

OTHER PUBLICATIONS

International Search Report and Written Opinion mailed on Aug. 30, 2021, in corresponding PCT/CN2021/095316, 6 pages.
(Continued)

*Primary Examiner* — Chad M Dicke
*Assistant Examiner* — Jeremy Daniel Watts
(74) *Attorney, Agent, or Firm* — XSENSUS LLP (57) ABSTRACT

A display panel includes an array substrate and an encapsulation layer encapsulated on a surface of the array substrate. The display panel further includes a stretching area located in a corner area of the display panel and at least partially located in a display area of the display panel, and the stretching area is provided with a hollow opening penetrating through the array substrate and the encapsulation layer.

16 Claims, 7 Drawing Sheets

(51) Int. Cl.
     *H10K 59/121*      (2023.01)
     *H10K 59/126*      (2023.01)
     *H10K 102/00*      (2023.01)

(52) U.S. Cl.
     CPC ....... *H10K 59/1216* (2023.02); *H10K 59/126* (2023.02); *H10K 59/352* (2023.02); *H10K 2102/311* (2023.02)

(56) References Cited

U.S. PATENT DOCUMENTS

| | | | |
|---|---|---|---|
| 2016/0307987 A1* | 10/2016 | Rankov | H10D 30/6728 |
| 2018/0331124 A1* | 11/2018 | Cho | H10D 86/60 |
| 2019/0081127 A1* | 3/2019 | Shim | H10K 77/111 |
| 2019/0140030 A1* | 5/2019 | Huangfu | H10K 50/8428 |
| 2020/0006704 A1 | 1/2020 | Zhang et al. | |
| 2020/0105843 A1* | 4/2020 | Baek | H10K 59/353 |
| 2020/0136089 A1 | 4/2020 | Zhang et al. | |
| 2020/0358025 A1 | 11/2020 | Tan | |
| 2022/0013083 A1* | 1/2022 | Cheng | G09F 9/30 |

FOREIGN PATENT DOCUMENTS

| | | |
|---|---|---|
| CN | 109390359 A | 2/2019 |
| CN | 109686842 A | 4/2019 |
| CN | 110689810 A | 1/2020 |
| CN | 111584595 A | 8/2020 |

OTHER PUBLICATIONS

Office Action issued on Aug. 12, 2022, in corresponding Chinese patent Application No. 202010454585.X, 12 pages.

\* cited by examiner

DISPLAY PANEL HAVING HOLLOW OPENING AND DISPLAY DEVICE

CROSS-REFERENCE TO RELATED APPLICATIONS

This application is based upon International Application No. PCT/CN2021/095316 filed on May 21, 2021, which claims priority to Chinese Patent Application No. 202010454585.X, entitle "DISPLAY PANEL AND DISPLAY DEVICE" filed on May 26, 2020, the entire contents thereof are incorporated herein by reference.

TECHNICAL FIELD

The present disclosure relates to the field of display technology, and in particular, to a display panel and a display device.

BACKGROUND

In a display panel of four-curved surface screen, the edge of the display panel may form a radian with a certain bending radius, so that front and side surfaces of the display panel simultaneously display and thus a comprehensive three-dimensional display effect is presented. In the related art, the display panel of four-curved surface screen may include an array substrate, an encapsulation layer encapsulated on a surface of the array substrate, and a cover plate. When manufacturing the display panel of four-curved surface screen, edges of the array substrate and the encapsulation layer need to be bent towards a base substrate of the array substrate, and then the cover plate is attached thereto by 3D cover glass lamination technology.

However, when the edges of the array substrate and the encapsulation layer are bent toward the base substrate of the array substrate, the corner areas thereof need to be stretched in the bending direction, which may easily cause wrinkle or tensile fracture at the four corners of the array substrate and the encapsulation layer. At the same time, since the edge length of the display panel before being bent is greater than the edge length of the display panel after being bent, when the display panel is bent at the edges thereof, wrinkle will appear in the corner area, which will squeeze and destroy the structure of the corner area of the display panel.

It should be noted that the information disclosed in the above background section is only for enhancement of understanding of the background of the present disclosure, and therefore may contain information that does not form the prior art that is already known to a person skilled in the art.

SUMMARY

An aspect of the present disclosure provides a display panel, including an array substrate and an encapsulation layer encapsulated on a surface of the array substrate, the display panel further includes: a stretching area, located in a corner area of the display panel and at least partially located in a display area of the display panel, the stretching area being provided with a hollow opening penetrating through the array substrate and the encapsulation layer.

In an exemplary embodiment of the present disclosure, the display panel further includes a normal display area located in the display area, the array substrate includes a base substrate and a functional layer on a surface of the base substrate facing the encapsulation layer, a sub-pixel unit is formed in the functional layer, and the stretching area includes: a first stretching area, located in the display area, a pixel density of the first stretching area being smaller than a pixel density of the normal display area, wherein an orthographic projection, on the base substrate, of the sub-pixel unit in the first stretching area does not overlap with an orthographic projection of the hollow opening on the base substrate.

In an exemplary embodiment of the present disclosure, the display panel further includes a frame area around the display area, and the stretching area further includes: a second stretching area, located in the frame area.

In an exemplary embodiment of the present disclosure, the display panel further includes: a transition area, located in the display area between the first stretching area and the normal display area, a pixel density of the transition area being smaller than the pixel density of the normal display area, wherein a gate driving circuit is integrated in the transition area, and the gate driving circuit is configured to provide a driving signal to the sub-pixel unit in the transition area and the sub-pixel unit in a same row with the sub-pixel unit in the transition area, and an orthographic projection, on the base substrate, of the sub-pixel unit in the transition area does not overlap with an orthographic projection of the gate driving circuit on the base substrate.

In an exemplary embodiment of the present disclosure, the gate driving circuit includes: a first gate driving circuit, configured to provide a gate driving signal to the sub-pixel unit; and a second gate driving circuit, configured to provide an enable signal to the sub-pixel unit.

In an exemplary embodiment of the present disclosure, the display panel is a rounded rectangle and includes four stretching areas, and the four stretching areas are respectively located in four rounded corner areas of the rounded rectangle.

In an exemplary embodiment of the present disclosure, the first stretching area, the second stretching area and the transition area are concentric fan shapes, the first stretching area is located at a side of the second stretching area facing a center of a circle where the second stretching area is located, and the transition area is located at a side of the first stretching area facing a center of a circle where the first stretching area is located.

In an exemplary embodiment of the present disclosure, in the normal display area: an R pixel opening, a G pixel opening, and a B pixel opening are sequentially and alternatively distributed along a same pixel opening row; in the same pixel opening row, two G pixel openings distributed along a column direction are arranged between the R pixel opening and the B pixel opening; in adjacent pixel opening rows, pixel openings of a same color are not located in a same column; and in two pixel opening rows separated by one pixel opening row, the pixel openings of the same color are located in the same column.

In an exemplary embodiment of the present disclosure, in the first stretching area and the transition area: the display panel includes a plurality of pixel islands distributed in an array, and the orthographic projection of the hollow opening on the base substrate is located between orthographic projections of the pixel islands on the base substrate; and the orthographic projection of the gate driving circuit on the base substrate is located between the orthographic projections of the pixel islands on the base substrate.

In an exemplary embodiment of the present disclosure, each of the pixel islands includes the B pixel opening and the R pixel opening located in a first pixel opening row and adjacently arranged, two G pixel openings located in a second pixel row and distributed along the column direction, and the B pixel opening and the R pixel opening located in a third pixel opening row and adjacently arranged; and the second pixel opening row is located between the first pixel opening row and the third pixel opening row, the pixel openings of the same color are located in the same column, and the pixel openings of different colors are located in different columns.

In an exemplary embodiment of the present disclosure, the pixel island includes the R pixel opening, the G pixel opening, and the B pixel opening located in the same pixel opening row, and in the same pixel opening row, the R pixel opening and the G pixel opening are distributed along the column direction.

In an exemplary embodiment of the present disclosure, the normal display area is driven by a GGRB algorithm; and the first stretching area and transition area are driven by a true RGB algorithm.

In an exemplary embodiment of the present disclosure, the sub-pixel unit includes a light-emitting unit and a pixel driving circuit for supplying a driving current to the light-emitting unit, and in the first stretching area and the transition area, an aspect ratio of the pixel driving circuit is 3:1; and in the normal display area, the aspect ratio of the pixel driving circuit is 2:1.

In an exemplary embodiment of the present disclosure, the display panel further includes a first gate layer on a surface of the base substrate, the pixel driving circuit includes a driving transistor and a capacitor connected to a gate of the driving transistor. The pixel driving circuit in the first stretching area and the transition area includes: a first conductive part, located in the first gate layer and forming the gate of the driving transistor and a first electrode of the capacitor. The pixel driving circuit in the normal display area includes: a second conductive part, located in the first gate layer and forming the gate of the driving transistor and the first electrode of the capacitor. A ratio of a dimension in a row direction to a dimension in the column direction of the first conductive part is smaller than a ratio of a dimension in the row direction to a dimension in the column direction of the second conductive part, the row direction is a width direction of the pixel driving circuit, and the column direction is a length direction of the pixel driving circuit.

In an exemplary embodiment of the present disclosure, the pixel driving circuit includes a driving transistor and a second transistor, a second terminal of the second transistor is connected to a gate of the driving transistor, and the second transistor is of a dual-channel structure. The pixel driving circuit in the normal display area includes: a first active part, located in the active layer and connected between two channels of the second transistor; and a first shielding part, located in the second gate layer and connected to a stable voltage source, an orthographic projection of the first shielding part on the base substrate extending in a row direction, and at least partially overlapping with an orthographic projection, on the base substrate, of the first active part in the pixel driving circuit adjacent to the first shielding part. The pixel driving circuit in the first stretching area and the transition area includes: a second active part, located in the active layer and connected between the two channels of the second transistor; a third active part, connected to the gate of the driving transistor; and a second shielding part, located in the second gate layer and connected to the stable voltage source, the second shielding part including a first sub-shielding part and a second sub-shielding part that are connected to each other, an orthographic projection of the first sub-shielding part on the base substrate extending in the column direction, and an orthographic projection of the second sub-shielding part on the base substrate extending in the row direction, wherein the orthographic projection of the first sub-shielding on the base substrate at least partially overlaps with an orthographic projection of the third active part on the base substrate, and the orthographic projection of the second sub-shielding part on the base substrate at least partially overlaps with an orthographic projection, on the base substrate, of the second active part in the pixel driving circuit adjacent to the second sub-shielding part.

An aspect of the present disclosure provides a display device including the above display panel.

It is to be understood that the foregoing general description and the following detailed description are exemplary and explanatory only and are not restrictive of the present disclosure.

BRIEF DESCRIPTION OF THE DRAWINGS

The accompanying drawings herein, which are incorporated in and constitute a part of this specification, illustrate embodiments consistent with the present disclosure, and together with the description serve to explain the principle of the present disclosure. Obviously, the drawings in the following description are only some embodiments of the present disclosure, and for a person skilled in the art, other drawings may also be obtained from these drawings without creative effort.

DETAILED DESCRIPTION

Example embodiments will now be described more fully with reference to the accompanying drawings. Example embodiments, however, may be embodied in various forms and should not be construed as being limited to the examples set forth herein. Rather, these embodiments are provided so that the present disclosure will be thorough and complete, and will fully convey the concept of example embodiments to a person skilled in the art. The same reference numerals in the drawings denote the same or similar structures, and thus their detailed descriptions will be omitted herein.

Although relative terms such as "upper" and "lower" are used in this specification to describe the relative relationship of one component shown to another component, these terms are used in this specification only for convenience of description for example according to the direction of the example described. It can be understood that if a device shown is turned upside down, a component described as being "upper" will become a "lower" component. Other relative terms such as "high", "low", "top", "bottom", "left" and "right" are to be understood similarly. When a certain structure is "on" another structure, it may mean that the certain structure is integrally formed on said another structure, or that the certain structure is "directly" arranged on said another structure, or that the certain structure is "indirectly" arranged on said another structure through an additional structure.

The terms "a", "an", "the" are used to indicate the presence of one or more elements/components/etc.; and the terms "including" and "having" are used to indicate an open-ended inclusive meaning and refer to that additional elements/components/etc. may be present in addition to the listed elements/components/etc.

Figure 1:
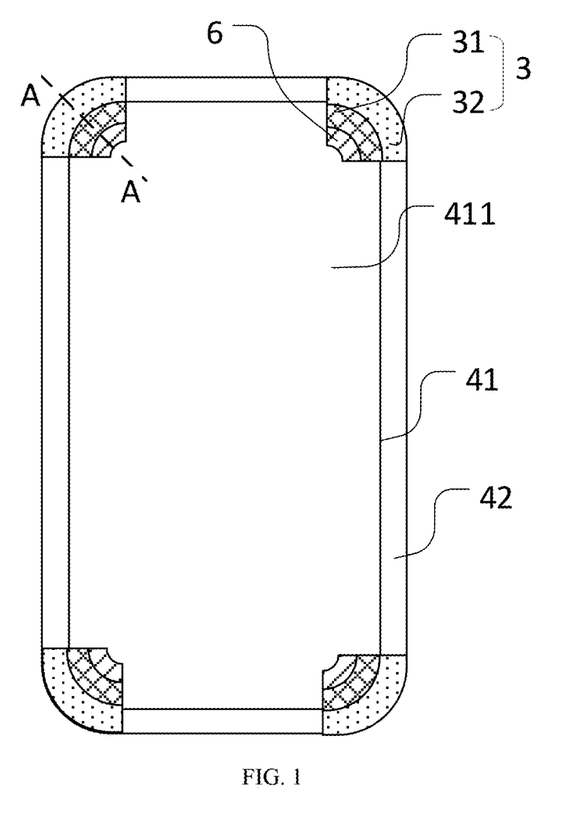
FIG. 1 is a schematic structural diagram of a display panel according to an exemplary embodiment of the present disclosure.
Figure 2:
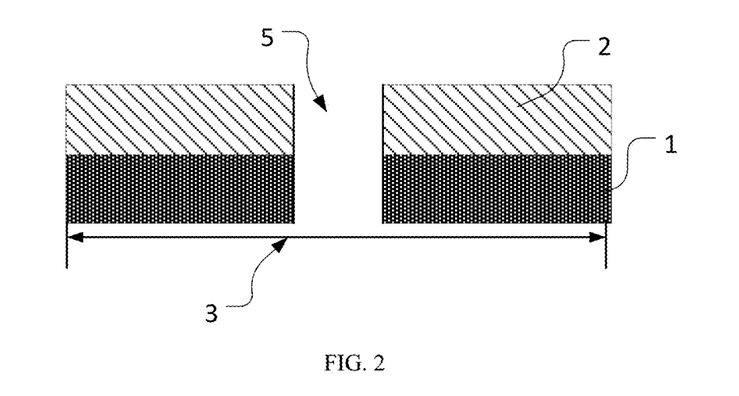
FIG. 2 is a cross-section view taken in the dotted line A-A in FIG. 1.

An exemplary embodiment of the present disclosure provides a display panel, as shown in FIGS. 1 and 2. FIG. 1 is a schematic structural diagram of a display panel according to an exemplary embodiment of the present disclosure, and FIG. 2 is a cross-section view taken in the dotted line A-A in FIG. 1. The display panel includes an array substrate 1 and an encapsulation layer 2 encapsulated on a surface of the array substrate. The display panel further includes a stretching area 3, and the stretching area 3 is located in a corner area of the display panel and at least partially located in a display area 41 of the display panel. The stretching area 3 is provided with a hollow opening 5 penetrating through the array substrate 1 and the encapsulation layer 2.

The display panel provided by the present disclosure is provided with the hollow opening penetrating through the array substrate and the encapsulation layer in the stretching area. On the one hand, the hollow opening may improve the bending ability and stretching ability of the stretching area of the display panel, thereby avoiding a fracture damage when the stretching area is bent; on the other hand, the hollow opening may provide a space for accommodating a wrinkle when the stretching area is bent, so as to avoid the wrinkle when the stretching area is bent.

It can be understood that in another exemplary embodiment, the display panel may be provided with the hollow opening only in the array substrate, and with no hollow openings in the encapsulation layer.

In an exemplary embodiment, the corner area of the display panel may refer to an intersecting position of two edges of the display panel, and the position of the two intersecting edges may be a right-angle connection or a rounded connection. As shown in FIG. 1, the display panel may be a rounded rectangle, and may include four stretching areas 3, and the four stretching areas 3 may be respectively located in four rounded corner areas of the rounded rectangle. It can be understood that in another exemplary embodiment, the display panel may also be a special-shaped display panel. For example, the display panel may be of hexagon. Correspondingly, the display panel may include six stretching areas, the six stretching areas may be respectively arranged in the six corner areas of the hexagon, and the stretching area 3 may also be of other shapes.

Figure 3:
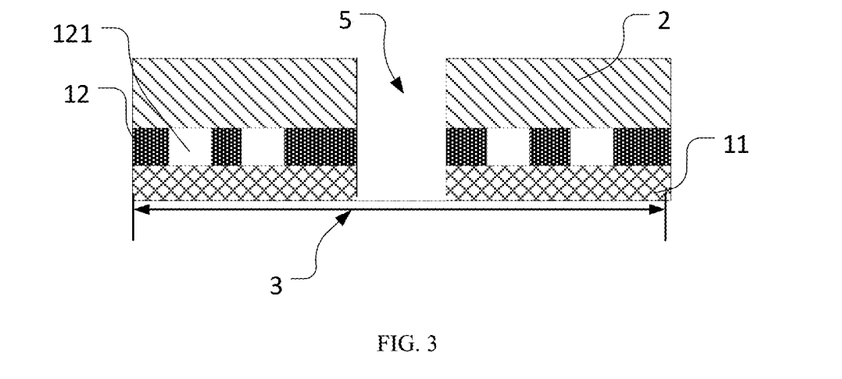
FIG. 3 is a cross-section view of a corner area of a display panel according to an exemplary embodiment of the present disclosure.

In an exemplary embodiment, as shown in FIG. 1, the display panel may further include a normal display area 411 located in the display area 41. FIG. 3 is a cross-section view of a corner area of a display panel according to an exemplary embodiment of the present disclosure. As shown in FIG. 3, the array substrate 1 may include a base substrate 11 and a functional layer 12 located on a surface of the base substrate 11 facing the encapsulation layer 2. The functional layer 12 is provided with a plurality of sub-pixel units 121. The stretching area 3 includes a first stretching area 31, and the first stretching area 31 is located in the display area 41. A pixel density of the first stretching area 31 is lower than that of the normal display area 411. An orthographic projection, on the base substrate 11, of the sub-pixel unit 121 in the first stretching area 31 does not overlap with an orthographic projection of the hollow opening 5 on the base substrate 11. The first stretching area 31 is provided with the sub-pixel units, that is, the first stretching area 31 may realize a display function. When forming a display panel of four-curved surface screen, the first stretching area 31 is bent, so that front and side surfaces of the display panel simultaneously display and thus a comprehensive three-dimensional display effect is presented. The functional layer may include a transistor TFT layer, a pixel definition layer, a light-emitting unit layer, and the like.

It should be noted that the orthographic projection of the sub-pixel unit 121 on the base substrate 11 does not overlap with the orthographic projection of the hollow opening 5 on the base substrate 11, so as to avoid the affect of the hollowing opening 5 penetrating through the array substrate and the encapsulation layer on the sub-pixel unit 121. Meanwhile, in the exemplary embodiment, the pixel density of the first stretching area 31 is smaller than that of the normal display area 411, so that a space may be reserved in the first stretching area 31 for arranging the hollow opening 5. It can be understood that, in another exemplary embodiment, the space for arranging the hollow opening 5 may also be reserved in other ways, for example, the area of the sub-pixel unit in the first stretching area 31 may be reduced to reserve the space for arranging the hollow opening 5.

In an exemplary embodiment, as shown in FIG. 1, the display panel may further include a frame area 42 located around the display area 41, and the stretching area 3 may further include a second stretching area 32 which is located in the frame area 42. The sub-pixel unit may not be arranged in the second stretching area 32, and the second stretching area 32 is only used to realize the bending of the frame of the display panel.

Figure 4:
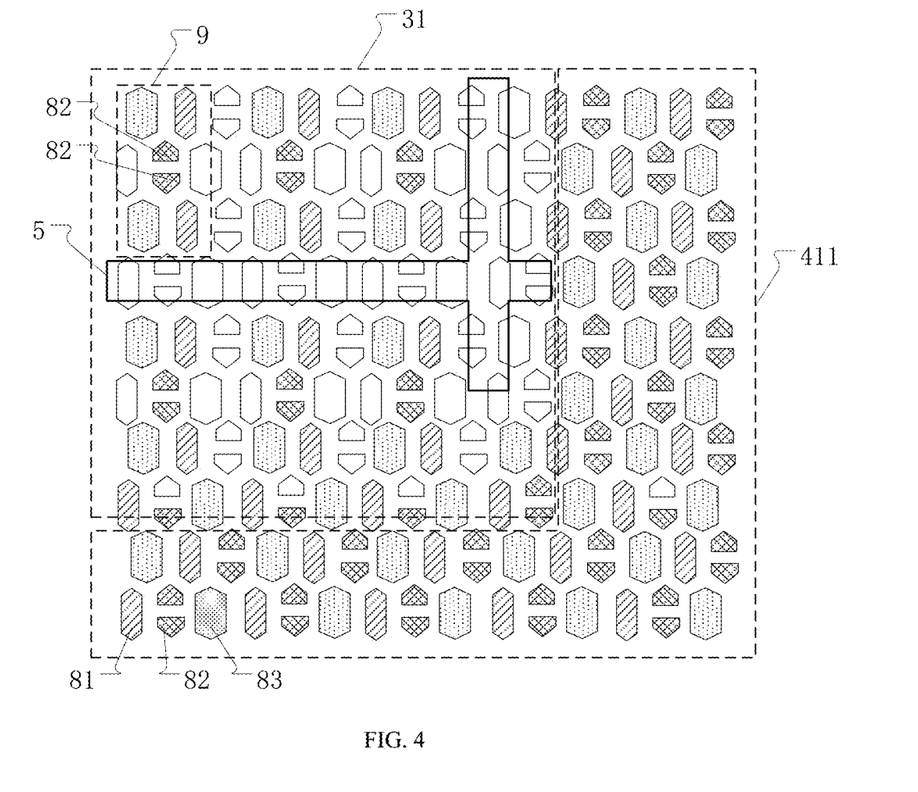
FIG. 4 is a distribution diagram of pixel openings of a display panel according to an exemplary embodiment of the present disclosure.

In an exemplary embodiment, the normal display area and the first stretching area have different pixel densities, and accordingly, the normal display area and the first stretching area have different pixel opening distributions. FIG. 4 is a distribution diagram of pixel openings of a display panel according to an exemplary embodiment of the present disclosure. As shown in FIG. 4, in the normal display area: an R pixel opening 81, a G pixel opening 82, and a B pixel opening 83 are sequentially and alternatively distributed along a same pixel opening row; in the same pixel opening row, two G pixel openings 82 distributed along a column direction are arranged between the R pixel opening 81 and the B pixel opening 83; in adjacent pixel opening rows, pixel openings of a same color are not located in a same column; and in two pixel opening rows separated by one pixel opening row, the pixel openings of the same color are located in the same column.

In an exemplary embodiment, as shown in FIG. 4, in the first stretching area, the display panel may include a plurality of pixel islands 9 distributed in an array, and the orthographic projection of the hollow opening 5 on the base substrate may be located between orthographic projections of adjacent pixel islands 9 on the base substrate. As shown in FIG. 4, in an exemplary embodiment, each of the pixel islands 9 may include the B pixel opening 83 and the R pixel opening 81 located in a first pixel opening row and adjacently arranged, two G pixel openings 82 located in a second pixel row and distributed along the column direction, and the B pixel opening 83 and the R pixel opening 81 located in a third pixel opening row and adjacently arranged. The second pixel opening row is located between the first pixel opening row and the third pixel opening row, the pixel openings of the same color are located in the same column, and the pixel openings of different colors are located in different columns. As shown in FIG. 4, in an exemplary embodiment, the pixel openings in the first stretching area and the normal display area have the same shape and size, and the only difference between the pixel opening in the first stretching area 31 and the pixel opening in the normal display area 411 is that there are no pixel openings in some positions of the first stretching area 31. Therefore, when each organic layer of the light-emitting unit is vapor-deposited on the pixel definition layer of the display panel through a high-precision metal mask, the light-emitting units in the normal display area and the first stretching area may be vapor-deposited using the high precision metal mask with the same opening shape and opening density at various positions thereof, which may improve the stress uniformity of each area when the high precision metal mask is stretched.

In FIG. 4, the distribution of the hollow openings 5 is a cross shape. It can be understood that in another exemplary embodiment, the distribution of the hollow openings 5 may also be in other ways, for example, in a "⊤" shape, a "⊥" shape and the like.

It should be noted that although the display panel is vapor-deposited through the high precision metal mask with the same opening shape and opening density, in the first stretching area, the vapor-deposited organic layer can only form the light-emitting unit, that can emit light, at the pixel opening position. In the first stretching area 31, an anode exposed by the pixel definition layer is provided at the pixel opening position, therefore the organic layer vapor-deposited at the pixel opening position can form the light-emitting unit connected to the anode, and the anode is not exposed or the hollow opening is provided in the area where the pixel opening is not provided. Therefore, the light-emitting unit that can emit light cannot be formed in the area other than the pixel opening.

As shown in FIG. 4, the sub-pixel unit in the normal display area 411 may be driven by GGRB algorithm. That is, a R sub-pixel may form a pixel unit with a B sub-pixel and G sub-pixel on the left, and the R sub-pixel may also form another pixel unit with a B sub-pixel and G sub-pixel on the right. In a similar way, a B sub-pixel may form a pixel unit with a R sub-pixel and G sub-pixel on the left, and the B sub-pixel may also form another pixel unit with a R sub-pixel and G sub-pixel on the right. The driving method may improve the resolution of the display panel.

As shown in FIG. 4, the sub-pixel unit in the first stretching area 31 may be driven by true RGB algorithm. That is, each of R, G, and B sub-pixels forms only one pixel unit. It should be noted that since the R and B sub-pixels are shared in the GGRB algorithm, the number of G sub-pixels in the normal display area is twice that of R and B sub-pixels; while the pixel units in the true RGB algorithm do not share sub-pixel units, the numbers of the R, G, and B sub-pixels in the first stretching area 31 are the same. Therefore, the number of the G sub-pixels in the first stretching area 31 is half of that of the G sub-pixels in the normal display area. Correspondingly, when driving the sub-pixel unit in the first stretching area 31, it is necessary to increase the driving voltage of the G sub-pixel. This solution may be implemented by designing an IC algorithm, or by driving the sub-pixel units of the normal display area 411 and the first stretching area 31 by different ICs respectively.

As shown in FIG. 4, the normal display area 411 uses the GGRB algorithm to drive the sub-pixel units, and each of the R and B sub-pixels is common to two pixel units. Therefore, only two sub-pixels need to be arranged in each square pixel unit. However, the first stretching area 31 is driven by the true RGB algorithm, and three sub-pixels need to be arranged in each square pixel unit. Therefore, in the first stretching area, an aspect ratio of the pixel unit is 3:1, and in the normal display area, an aspect ratio of the pixel unit is 2:1. The display panel may be a top emission display panel, in which the orthographic projection of the pixel opening on the base substrate is located on the orthographic projection of the pixel driving circuit on the base substrate, and the aspect ratio of the pixel unit in the display panel is the aspect ratio of the pixel drive circuit. Therefore, in the first stretching area, the aspect ratio of the pixel driving circuit is 3:1, and in the normal display area, the aspect ratio of the pixel driving circuit is 2:1.

Figure 5:
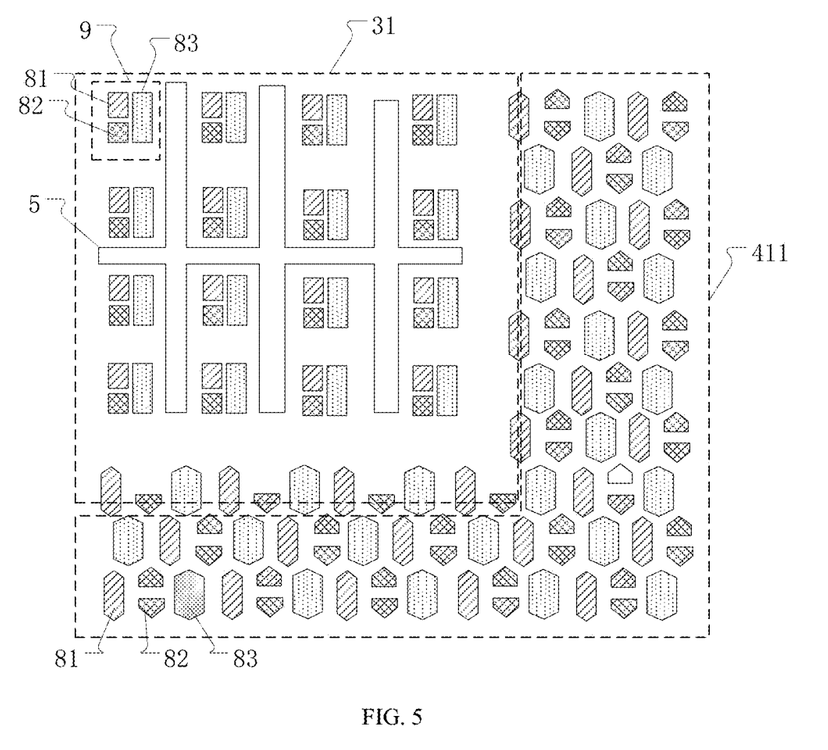
FIG. 5 is a distribution diagram of pixel openings of a display panel according to another exemplary embodiment of the present disclosure.

In an exemplary embodiment, as shown in FIG. 4, in order to reserve a space between the pixel islands 9 for arranging the hollow opening 5, it is necessary to arrange two G pixel openings 82 between adjacent rows of the R pixel openings and the B pixel openings. However, such arrangement causes a shift of a horizontal pixel brightness center, a lost of picture balance sense, a color shift reversal of upper and lower edges, and a sawtooth feeling in a diagonal direction, and these technical problems cannot be solved by the algorithm. FIG. 5 is a distribution diagram of pixel openings of a display panel according to another exemplary embodiment of the present disclosure. As shown in FIG. 5, the pixel island includes the R pixel opening 81, the G pixel opening 82, and the B pixel opening located 83 in the same pixel opening row, and in the same pixel opening row, the R pixel opening and the G pixel opening are distributed along the column direction. Such arrangement can avoid the above-mentioned technical problems of the shift of horizontal pixel brightness center, the lost of picture balance sense, the color shift reversal of upper and lower edges, and the sawtooth feeling in the diagonal direction. It can be understood that in another exemplary embodiment, the pixel island may also have other distributions of pixel openings, which all belong to the protection scope of the present disclosure.

Figure 6:
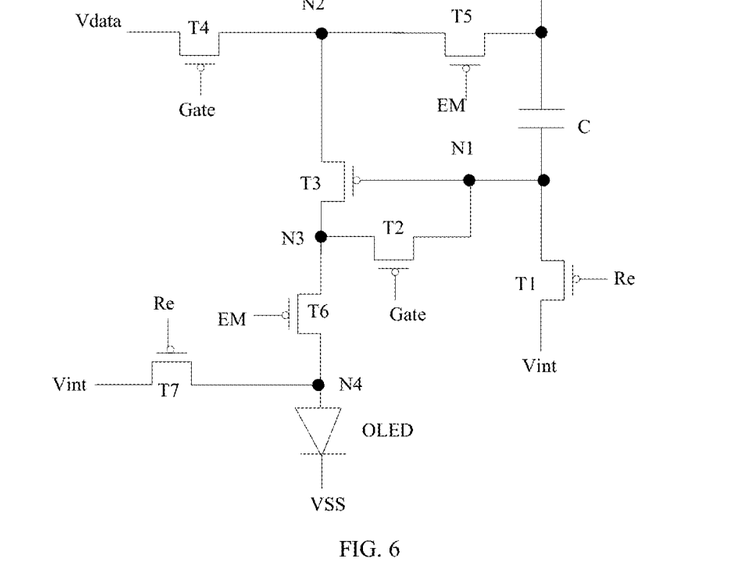
FIG. 6 is a schematic diagram of a circuit structure of a pixel driving circuit of a display panel according to an embodiment of the present disclosure.
Figure 7:
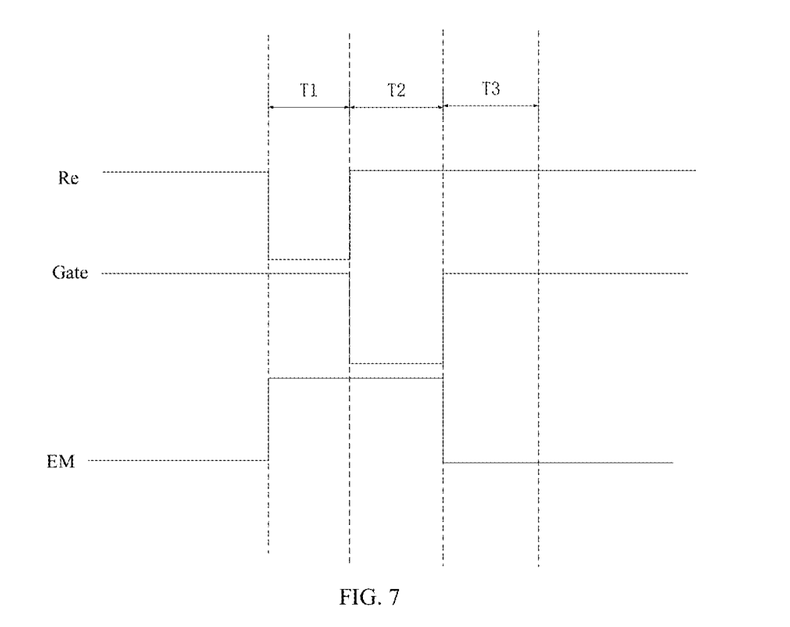
FIG. 7 is a timing diagram of each node of the pixel driving circuit in FIG. 6.
Figure 8:
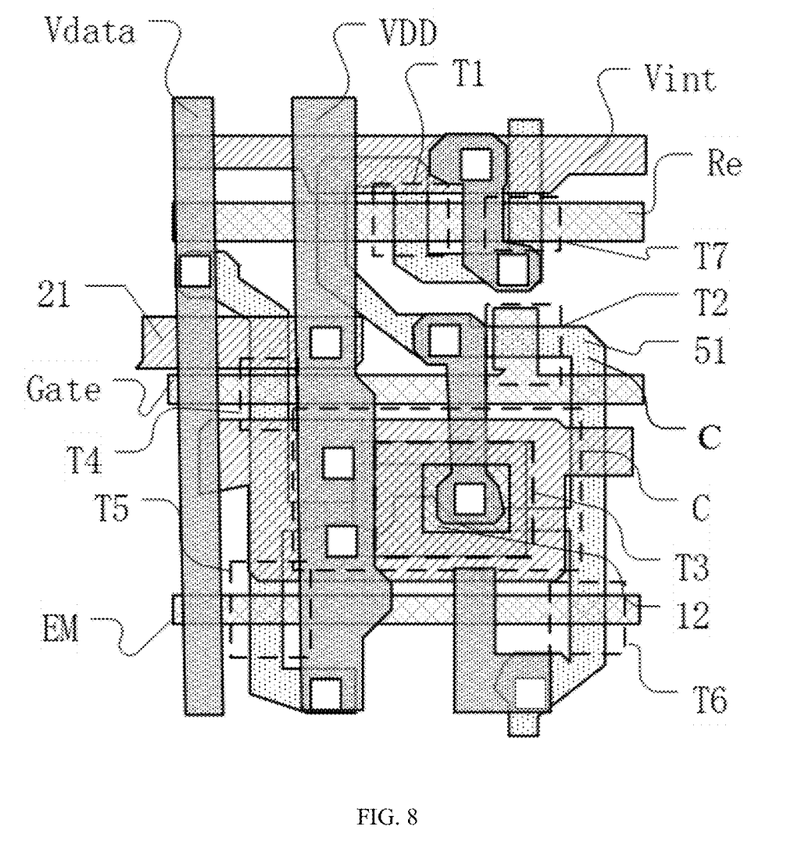
FIG. 8 is a schematic structural diagram of a pixel driving circuit in a normal display area of a display panel according to an embodiment of the present disclosure.
Figure 9:
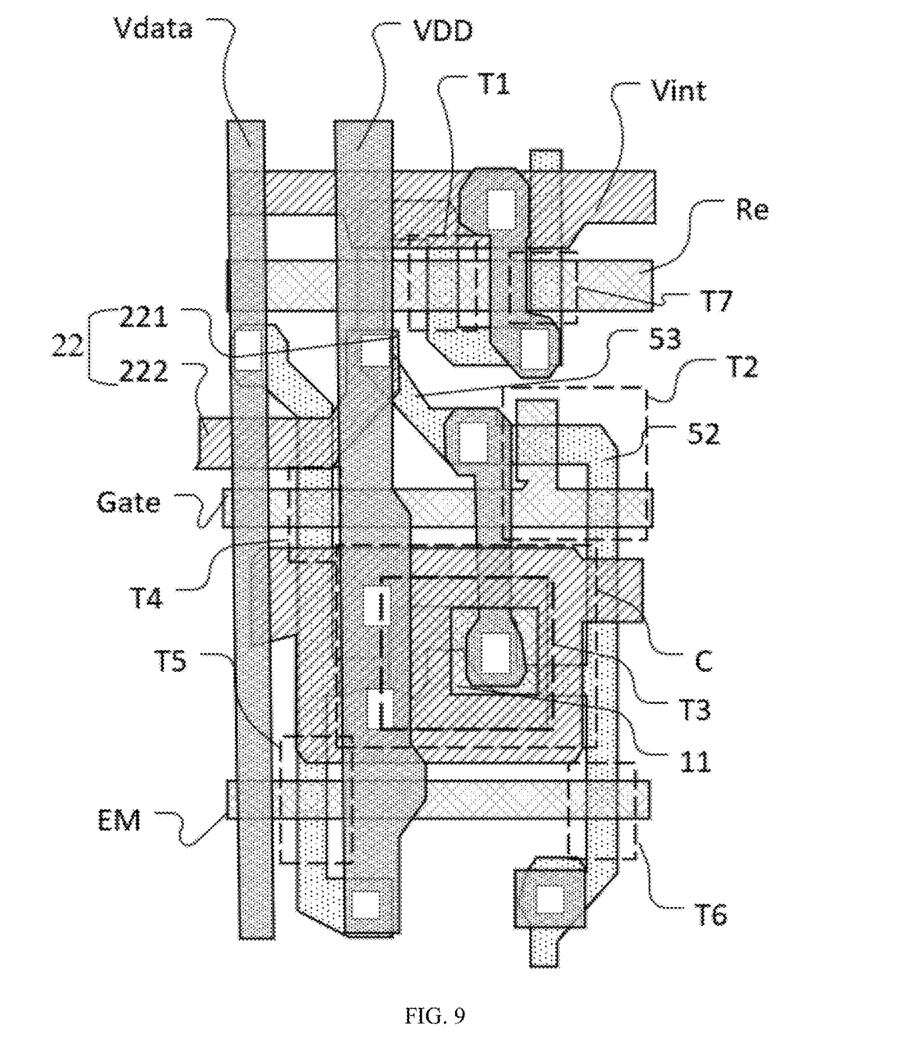
FIG. 9 is a schematic structural diagram of a pixel driving circuit in a first stretching area of a display panel according to an embodiment of the present disclosure.

FIG. 6 is a schematic diagram of a circuit structure of a pixel driving circuit of a display panel according to an embodiment of the present disclosure; FIG. 7 is a timing diagram of each node of the pixel driving circuit in FIG. 6; FIG. 8 is a schematic structural diagram of a pixel driving circuit in a normal display area of a display panel according to an embodiment of the present disclosure; and FIG. 9 is a schematic structural diagram of a pixel driving circuit in a first stretching area of a display panel according to an embodiment of the present disclosure. The aspect ratio of the pixel driving circuit in FIG. 9 is 3:1, and the aspect ratio of the pixel driving circuit in FIG. 8 is 2:1.

As shown in FIGS. 6, 8 and 9, the pixel driving circuit has a 7T1C structure. A fourth transistor T4 has a first terminal connected to a data signal terminal Vdata, a second terminal connected to a second node N2, and a gate connected to a gate driving signal terminal Gate. A fifth transistor T5 has a first terminal connected to the second node N2, a second terminal connected to a first power supply terminal VDD, and a gate connected to an enable signal terminal EM. A third transistor T3 has a first terminal connected to the second node N2, a second terminal connected to a third node N3, and a gate connected to a first node N1. A second transistor T2 has a first terminal connected to the third node N3, a second terminal connected to the first node N1, and a gate connected to the gate driving signal terminal Gate. A first transistor T1 has a first terminal connected to the first node N1, a second terminal connected to an initialization signal terminal Vint, and a gate connected to a reset signal terminal Re. A sixth transistor T6 has a first terminal connected to the third node N3, a second terminal connected to a fourth node N4, and a gate connected to the enable signal terminal EM. A seventh transistor T7 has a first terminal connected to the initialization signal terminal Vint, a second terminal connected to the fourth node N4, and a gate connected to the reset signal terminal Re. The pixel driving circuit may also include a light-emitting unit OLED, and the light-emitting unit OLED is connected between the fourth node and the second power supply terminal VSS.

As shown in FIG. 7, a driving method of the pixel driving circuit includes a reset stage T1, a threshold writing stage T2, and a light-emitting stage T3. In the reset stage T1, the reset signal terminal Re outputs a low-level signal, the enable signal terminal EM and the gate driving signal terminal Gate output a high-level signal, the first transistor T1 and the seventh transistor T7 are turned on, and the initialization signal terminal Vint inputs an initialization signal to the fourth node N4 and the first node N1. In the threshold writing stage T2, the gate driving signal terminal Gate outputs a low-level signal, the enable signal terminal EM and the reset signal terminal Re output a high-level signal, and the data signal terminal writes the voltage including the threshold of the third transistor T3 into the first node N1. In the light-emitting stage, the enable signal terminal EM outputs a low-level signal, and the light-emitting unit emits light.

As shown in FIGS. 8 and 9, the display panel may include a base substrate, an active layer, a first gate layer, a second gate layer, and a source-drain layer that are stacked in sequence. The active layer may be used to form a channel area of each transistor. The first gate layer may include a reset signal line Re for providing a reset signal terminal, a gate driving signal line Gate for providing a gate driving signal terminal, an enable signal line EM for providing an enable signal terminal, and a first electrode of a capacitor C. The second gate layer may include an initialization signal line Vinit for providing an initialization signal terminal, a second electrode of the capacitor C. The source-drain layer may include a power supply line VDD for providing a first power supply terminal, and a data line Data for providing a data signal terminal.

As shown in FIG. 9, in an exemplary embodiment, the pixel driving circuit in the first stretching area may include a first conductive part 11, and the first conductive part 11 may be located in the first gate layer for forming the gate of the drive transistor and the first electrode of the capacitor. As shown in FIG. 8, the pixel driving circuit in the normal display area may include a second conductive part 12, and the second conductive part 12 is located in the first gate layer for forming the gate of the driving transistor and the first electrode of the capacitor. A ratio of a dimension in a row direction to a dimension in the column direction of the first conductive part 11 is smaller than a ratio of a dimension in the row direction to a dimension in the column direction of the second conductive part 12, the row direction is a width direction of the pixel driving circuit, and the column direction is a length direction of the pixel driving circuit.

As shown in FIG. 8, the pixel driving circuit in the normal display area includes a first active part 51 and a first shielding part 21. The first active part 51 is located in the active layer, and the first active part 51 is connected between two channels of the second transistor. The first shielding portion 21 is located in the second gate layer and is connected to a stable voltage source. For example, the first shielding portion 21 may be connected to the power supply line VDD through a via hole (white square hole). An orthographic projection of the first shielding part 21 on the base substrate may extend in a row direction, and may at least partially overlap with an orthographic projection, on the base substrate, of the first active part 51 in the pixel driving circuit adjacent to the first shielding part 21. That is, the first shielding part 21 in FIG. 8 may be used to shield the first active part 51 in the pixel driving circuit on the left side thereof. The first shielding part 21 may stabilize the voltage of the first active part 51 to avoid the generation of current between the first active part 51 in a floating state and the source/drain of the second transistor, thereby further stabilizing the voltage of the gate of driving transistor in the light-emitting stage.

As shown in FIG. 9, the pixel driving circuit in the first stretching area includes a second active part 52, a third active part 53, and a second shielding part 22. The second active part 52 is located in the active layer, and is connected between two channels of the second transistor. The third active part 53 is connected to the gate of the driving transistor. The second shielding part is located in the second gate layer and is connected to a stable voltage source, for example, the second shielding part may be connected to the power supply line VDD through a via hole (white square hole). The second shielding part may include a first sub-shielding part 221 and a second sub-shielding part 222 that are connected to each other. An orthographic projection of the first sub-shielding part 221 on the base substrate extends in the column direction, and an orthographic projection of the second sub-shielding part 222 on the base substrate extends in the row direction. The orthographic projection of the first sub-shielding 221 on the base substrate at least partially overlaps with an orthographic projection of the third active part 53 on the base substrate, and the orthographic projection of the second sub-shielding part 222 on the base substrate at least partially overlaps with an orthographic projection, on the base substrate, of the second active part 52 in the pixel driving circuit adjacent to the second sub-shielding part 222. That is, the second sub-shielding part 222 in FIG. 9 may be used to shield the second active part 52 in the pixel driving circuit on the left side thereof. The first sub-shielding part 221 may stabilize the voltage of the gate of the driving transistor, and the second sub-shielding part 222 may stabilize the voltage of the second active part 52.

Figure 10:
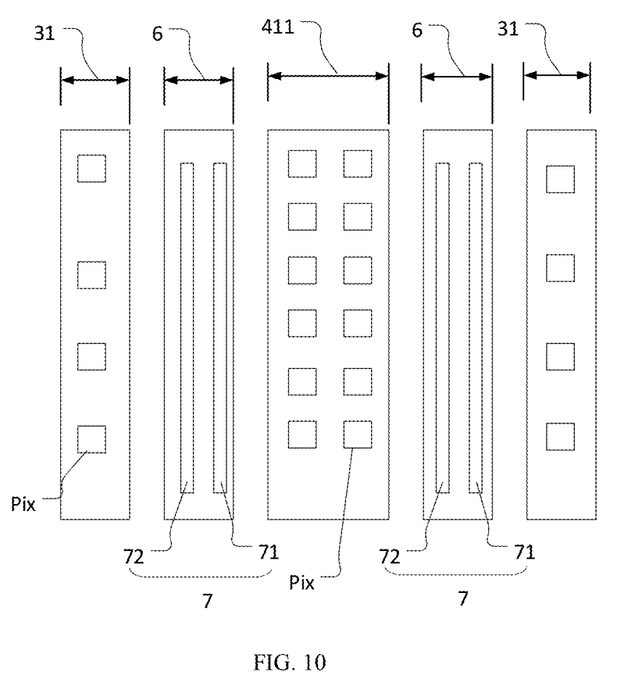
FIG. 10 is a schematic structural diagram of a display panel according to another exemplary embodiment of the present disclosure.

In an exemplary embodiment, as shown in FIG. 1, the display panel further includes a transition area 6, and the transition area 6 is located in the display area between the first stretching area 31 and the normal display area 411. A pixel density of the transition area 6 may be smaller than that of the normal display area 411. FIG. 10 is a schematic structural diagram of a display panel according to another exemplary embodiment of the present disclosure. The transition area 6 is integrated with a gate driving circuit 7, and the gate driving circuit 7 may be used to provide a driving signal to the sub-pixel unit in the transition area 6 and the sub-pixel unit in a same row with the sub-pixel unit in the transition area 6. For example, the gate driving circuit 7 located in the transition area 6 may provide the driving signal to the sub-pixel units in the first stretching area 31 and the normal display area 411, respectively. The orthographic projection, on the base substrate, of the sub-pixel unit in the transition area 6 does not overlap with the orthographic projection of the gate driving circuit on the base substrate. The pixel density of the transition area 6 is set to be smaller than that of the normal display area 411, so that a space for arranging the gate driving circuit may be reserved in the transition area 6. The orthographic projection, on the base substrate, of the sub-pixel unit in the transition area 6 and the orthographic projection of the gate driving circuit on the base substrate are arranged to not overlap with each other, so as to prevent the gate driving circuit from affecting the pixel unit. The distribution of the pixel openings in the transition area 6, the circuit structure of the pixel driving circuit, and the structure and shape of the pixel unit may be the same as those in the first stretching area 31. The orthographic projection of the gate driving circuit on the base substrate may be located between the orthographic projections of the pixel islands on the base substrate.

In an exemplary embodiment, as shown in FIG. 10, the gate driving circuit 7 may include a first gate driving circuit 71 and a second gate driving circuit 72. The first gate driving circuit 71 may be used to provide a gate driving signal to a sub-pixel unit Pix, and the second gate driving circuit 72 may be used to provide an enabling signal to the sub-pixel unit Pix.

In an exemplary embodiment, as shown in FIG. 1, the first stretching area 31, the second stretching area 32, and the transition area 6 may be concentric fan shapes, the first stretching area 31 is located at a side of the second stretching area 32 facing a center of a circle where the second stretching area 32 is located, and the transition area 6 may be located at a side of the first stretching area 31 facing a center of a circle where the first stretching area 31 is located. The center dividing line of the fan-shaped stretching area passing through the circle where the stretching area is located may pass through the intersection of two intersecting edges at the corner area where the stretching area is located. The first stretching area 31, the second stretching area 32 and the transition area 6 are arranged as fan shapes, which may greatly reduce the areas of the first stretching area 31, the second stretching area 31, and the transition area 6 while ensuring the realization of the functions thereof. It can be understood that in another exemplary embodiment, the first stretching area 31, the second stretching area 32, and the transition area 6 may have other shapes, for example, the first stretching area 31, the second stretching area 32 and the transition area 6 may be trapezoidal, rectangular, or the like.

An exemplary embodiment of the present disclosure also provides a display device including the above-mentioned display panel. The display device may be a display device such as a mobile phone, a TV, or a tablet computer.

A person skilled in the art may easily conceive of other embodiments of the present disclosure after considering the specification and practicing the content disclosed herein. This application is intended to cover any variations, uses, or adaptations of the present disclosure that follow the general principle of the present disclosure and include the common knowledge or technical means in the art not disclosed by the present disclosure. The specification and examples are to be regarded as exemplary only, with the true scope and spirit of the present disclosure being indicated by the claims.

It can be understood that the present disclosure is not limited to the precise structure described above and illustrated in the accompanying drawings, and that various modifications and changes may be made without departing from the scope thereof. The scope of the present disclosure is limited only by the appended claims.

What is claimed is:

1. A display panel, comprising an array substrate and a display area, wherein the display panel further comprises:
   a stretching area, located in a corner area of the display panel and at least partially located in the display area of the display panel, the stretching area being provided with a hollow opening penetrating through the array substrate,
   wherein the display panel further comprises an encapsulation layer encapsulated on a surface of the array substrate, and the hollow opening penetrates through the encapsulation layer,
   wherein the display panel further comprises a normal display area located in the display area, the array substrate comprises a base substrate and a functional layer on a surface of the base substrate facing the encapsulation layer, sub-pixel units are formed in the functional layer, and the stretching area comprises:
   a first stretching area, located in the display area, a pixel density of the first stretching area being smaller than a pixel density of the normal display area,
   wherein the display panel further comprises a frame area around the display area, and the stretching area further comprises:
   a second stretching area, located in the frame area,
   wherein the display panel further comprises:
   a transition area, located in the display area between the first stretching area and the normal display area and provided with a sub-pixel unit, a pixel density of the transition area being smaller than the pixel density of the normal display area,
   wherein the first stretching area, the second stretching area and the transition area are fan shapes respectively and are concentric.

2. The display panel according to claim 1,
   wherein an orthographic projection, on the base substrate, of each sub-pixel unit in the first stretching area does not overlap with an orthographic projection of the hollow opening on the base substrate.

3. The display panel according to claim 1,
   wherein a gate driving circuit is integrated in the transition area, and the gate driving circuit is configured to provide a driving signal to sub-pixel units, of a same row, in the transition area, the first stretching area and the normal display area, and
   wherein an orthographic projection, on the base substrate, of each sub-pixel unit in the transition area does not overlap with an orthographic projection of the gate driving circuit on the base substrate.

4. The display panel according to claim 3, wherein the gate driving circuit comprises:
   a first gate driving circuit, configured to provide a gate driving signal to the sub-pixel units; and
   a second gate driving circuit, configured to provide an enable signal to the sub-pixel units.

5. The display panel according to claim 3, wherein the display panel is a rounded rectangle and comprises four stretching areas, and the four stretching areas are respectively located in four rounded corner areas of the rounded rectangle.

6. The display panel according to claim 5, wherein the first stretching area is located at a side of the second stretching area facing a center of a circle where the second stretching area is located, and the transition area is located at a side of the first stretching area facing a center of a circle where the first stretching area is located.

7. The display panel according to claim 3, wherein in the normal display area:
an R pixel opening, a G pixel opening, and a B pixel opening are sequentially and alternatively distributed along a same pixel opening row;
in the same pixel opening row, two G pixel openings distributed along a column direction are arranged between the R pixel opening and the B pixel opening;
in adjacent pixel opening rows, pixel openings of a same color are not located in a same column; and
in two pixel opening rows separated by one pixel opening row, the pixel openings of the same color are located in the same column.

8. The display panel according to claim 7, wherein in the first stretching area and the transition area:
the display panel comprises a plurality of pixel islands distributed in an array, and the orthographic projection of the hollow opening on the base substrate is located between orthographic projections of adjacent pixel islands on the base substrate; and
the orthographic projection of the gate driving circuit on the base substrate is located between the orthographic projections of the adjacent pixel islands on the base substrate.

9. The display panel according to claim 8, wherein,
each of the pixel islands comprises the B pixel opening and the R pixel opening located in a first pixel opening row and adjacently arranged, two G pixel openings located in a second pixel row and distributed along the column direction, and the B pixel opening and the R pixel opening located in a third pixel opening row and adjacently arranged; and
the second pixel opening row is located between the first pixel opening row and the third pixel opening row, the pixel openings of the same color are located in the same column, and the pixel openings of different colors are located in different columns.

10. The display panel according to claim 8, wherein,
each of the pixel islands comprises the R pixel opening, the G pixel opening, and the B pixel opening located in the same pixel opening row, and in the same pixel opening row, the R pixel opening and the G pixel opening are distributed along the column direction.

11. The display panel according to claim 9, wherein each of the sub-pixel units comprises a light-emitting unit and a pixel driving circuit for supplying a driving current to the light-emitting unit, and in the first stretching area and the transition area, an aspect ratio of the pixel driving circuit is 3:1; and
in the normal display area, the aspect ratio of the pixel driving circuit is 2:1.

12. The display panel according to claim 11, wherein the display panel further comprises a first gate layer on a surface of the base substrate, the pixel driving circuit comprises a driving transistor and a capacitor connected to a gate of the driving transistor,
the pixel driving circuit in the first stretching area and the transition area comprises:

a first conductive part, located in the first gate layer and forming the gate of the driving transistor and a first electrode of the capacitor,
the pixel driving circuit in the normal display area comprises:
a second conductive part, located in the first gate layer and forming the gate of the driving transistor and the first electrode of the capacitor,
wherein a ratio of a dimension in a row direction to a dimension in the column direction of the first conductive part is smaller than a ratio of a dimension in the row direction to a dimension in the column direction of the second conductive part, the row direction is a width direction of the pixel driving circuit, and the column direction is a length direction of the pixel driving circuit.

13. The display panel according to claim 11, wherein the display panel further comprises an active layer and a second gate layer, the active layer is located on a surface of the base substrate, the second gate layer is located on a surface of the active layer away from the base substrate, the pixel driving circuit comprises a driving transistor and a second transistor, a second terminal of the second transistor is connected to a gate of the driving transistor, and the second transistor is of a dual-channel structure,
the pixel driving circuit in the normal display area comprises:
a first active part, located in the active layer and connected between two channels of the second transistor; and
a first shielding part, located in the second gate layer and connected to a stable voltage source, an orthographic projection of the first shielding part on the base substrate extending in a row direction, and at least partially overlapping with an orthographic projection, on the base substrate, of the first active part in the pixel driving circuit adjacent to the first shielding part,
the pixel driving circuit in the first stretching area and the transition area comprises:
a second active part, located in the active layer and connected between the two channels of the second transistor;
a third active part, connected to the gate of the driving transistor; and
a second shielding part, located in the second gate layer and connected to the stable voltage source, the second shielding part comprising a first sub-shielding part and a second sub-shielding part that are connected to each other, an orthographic projection of the first sub-shielding part on the base substrate extending in the column direction, and an orthographic projection of the second sub-shielding part on the base substrate extending in the row direction,
wherein the orthographic projection of the first sub-shielding on the base substrate at least partially overlaps with an orthographic projection of the third active part on the base substrate, and the orthographic projection of the second sub-shielding part on the base substrate at least partially overlaps with an orthographic projection, on the base substrate, of the second active part in the pixel driving circuit adjacent to the second sub-shielding part.

14. A display device, comprising a display panel, wherein the display panel comprises:
an array substrate and a display area;
a stretching area, located in a corner area of the display panel and at least partially located in the display area of the display panel, the stretching area being provided with a hollow opening penetrating through the array substrate, wherein the display panel further comprises an encapsulation layer encapsulated on a surface of the array substrate, and the hollow opening penetrates through the encapsulation layer, wherein the display panel further comprises a normal display area located in the display area, the array substrate comprises a base substrate and a functional layer on a surface of the base substrate facing the encapsulation layer, sub-pixel units are formed in the functional layer, and the stretching area comprises:

a first stretching area, located in the display area, a pixel density of the first stretching area being smaller than a pixel density of the normal display area, wherein the display panel further comprises a frame area around the display area, and the stretching area further comprises:

a second stretching area, located in the frame area, wherein the display panel further comprises:

a transition area, located in the display area between the first stretching area and the normal display area and provided with a sub-pixel unit, a pixel density of the transition area being smaller than the pixel density of the normal display area, wherein the first stretching area, the second stretching area and the transition area are fan shapes respectively and are concentric.

15. The display panel according to claim 10, wherein each of the sub-pixel units comprises a light-emitting unit and a pixel driving circuit for supplying a driving current to the light-emitting unit, and in the first stretching area and the transition area, an aspect ratio of the pixel driving circuit is 3:1; and in the normal display area, the aspect ratio of the pixel driving circuit is 2:1.

16. The display panel according to claim 15, wherein the display panel further comprises a first gate layer on a surface of the base substrate, the pixel driving circuit comprises a driving transistor and a capacitor connected to a gate of the driving transistor, the pixel driving circuit in the first stretching area and the transition area comprises:

a first conductive part, located in the first gate layer and forming the gate of the driving transistor and a first electrode of the capacitor, the pixel driving circuit in the normal display area comprises:

a second conductive part, located in the first gate layer and forming the gate of the driving transistor and the first electrode of the capacitor, wherein a ratio of a dimension in a row direction to a dimension in the column direction of the first conductive part is smaller than a ratio of a dimension in the row direction to a dimension in the column direction of the second conductive part, the row direction is a width direction of the pixel driving circuit, and the column direction is a length direction of the pixel driving circuit.

* * * * *